United States Patent [19]

Horne

[11] Patent Number: 5,269,851
[45] Date of Patent: Dec. 14, 1993

[54] SOLAR ENERGY SYSTEM

[75] Inventor: William E. Horne, Renton, Wash.

[73] Assignee: United Solar Technologies, Inc., Olympia, Wash.

[21] Appl. No.: 970,948

[22] Filed: Nov. 3, 1992

Related U.S. Application Data

[63] Continuation of Ser. No. 660,623, Feb. 25, 1991, abandoned.

[51] Int. Cl.⁵ .................. H01L 31/058; H01L 31/052
[52] U.S. Cl. ..................... 136/248; 136/246
[58] Field of Search ................. 136/246, 248

[56] References Cited

U.S. PATENT DOCUMENTS

| | | | |
|---|---|---|---|
| 4,052,228 | 10/1977 | Russell | 136/246 |
| 4,081,289 | 3/1978 | Campbell, III | 136/246 |
| 4,143,233 | 3/1979 | Kapany | 136/259 |
| 4,158,356 | 6/1979 | Wininger | 126/425 |
| 4,278,829 | 7/1981 | Powell | 136/248 |
| 4,339,627 | 7/1982 | Arnould | 136/259 |
| 4,395,582 | 7/1983 | Damsker | 136/248 |
| 4,700,013 | 10/1987 | Soule | 136/248 |
| 4,892,593 | 1/1990 | Lew | 136/246 |

FOREIGN PATENT DOCUMENTS

| | | | |
|---|---|---|---|
| 3226167 | 1/1984 | Fed. Rep. of Germany | 136/248 |
| 57-26478 | 2/1982 | Japan | 136/248 |
| 58-122785 | 7/1983 | Japan | 136/248 |

Primary Examiner—Aaron Weisstuch
Attorney, Agent, or Firm—Jensen & Puntigam

[57] ABSTRACT

A solar energy system that includes a primary concentrator, a receiver having a plurality of photovoltaic cells, and a prefilter surrounding the receiver. The prefilter absorbs some of the radiation that is out of band with respect to the photovoltaic cells, and may include a conduit for a cooling fluid. The cells on the receiver are positioned such that each cell receives the same solar energy flux. The receiver may include a phase change material to protect the photovoltaic cells from excessive temperatures.

7 Claims, 5 Drawing Sheets

SOLAR ENERGY SYSTEM

This is a continuation of application Ser. No. 660,623, filed on Feb. 25, 1991, now abandoned.

FIELD OF THE INVENTION

The present invention relates to systems for converting solar energy into electrical energy, using photovoltaic cells.

BACKGROUND OF THE INVENTION

Photovoltaic cells are often the most expensive components of solar energy systems. As a result, one prior approach to building solar energy systems has been to use large quantities of low-cost cells, e.g., polycrystalline thin film cells, of the type designed to operate on unconcentrated sunlight. However, this approach yields very low conversion efficiency, and has not proved economic. A second and generally more efficient approach to solar energy systems has been to use concentrators to concentrate the solar energy onto relatively high performance (and high cost) photovoltaic cells, such as GaAs/GaSb cells.

Unfortunately, the use of concentrators presents a number of new problems. For example, virtually all known photovoltaic cells operate less efficiently as their temperature increases. The use of concentrators tends to cause the cells to operate at a higher temperature, thereby decreasing system efficiency. This creates a difficult tradeoff between cost and conversion efficiency.

A further problem with concentrator designs is that the illumination field at the focal point of a concentrator is usually very intense, and nonuniform. The intensity makes it difficult to take advantage of all of the incident sunlight, because some of the area in the intense light field is required for interconnecting conductors and geometric cell mounting considerations. The result is poor utilization of expensive photovoltaic cells. Furthermore, the large currents generated by the intense light field require heavy contact grid lines on the cells, and for interconnecting conductors. The nonuniformity of the illumination results in different temperatures, currents, and voltages in the individual photovoltaic cells. In addition, the cells in concentrator arrangements are subject to rapid thermal damage if coolant is lost, or if hot spots are formed by flaws in the concentrator.

Tandem photovoltaic cells have been developed to increase conversion efficiency in solar energy systems. In a tandem cell, solar radiation that passes through a primary cell is incident on a secondary cell that typically has a wavelength absorbing region different from that of the primary cell. Thus the secondary cell can utilize some of the radiation not converted by the primary cell, thereby increasing the overall conversion efficiency. However, in general, the secondary cell costs as much as the primary cell, but only produces a fraction (e.g., 30 percent) of the amount of electricity produced by the primary cell. Thus the electrical energy produced per unit cost is often quite low in tandem designs.

Another prior attempt to increase conversion efficiency relates to the fact that in a solar energy system, much of the incident solar energy that is not converted to electricity appears as heat. Attempts have therefore been made to utilize some of such heat in so-called cogeneration facilities that produce both electrical and thermal energy outputs. However, cogeneration systems present a fundamental design conflict. The conflict is due to the fact that the photovoltaic cells must be operated at as low a temperature as possible, in order to maximize their electrical conversion efficiency. However, thermal energy must be delivered at as high a temperature as possible, in order to maximize the thermodynamic efficienctly of the thermal energy system.

One prior approach to solving the conflicting requirements set forth above has been distributed point focus systems, which comprise an array of small lenses, each of which has a photovoltaic cell at its focal point. However, such systems typically have relatively low concentration, and require more cell area than designs that use a single central receiver. Further, when tandem cells are used to boost efficiency, the rear cells in the tandem stack double the overall cost, while increasing the electrical output by a smaller amount.

SUMMARY OF THE INVENTION

The problems set forth above are substantially overcome by the solar energy system of the present invention. In one preferred embodiment, the system comprises photovoltaic means and prefiltering means. The photovoltaic means comprises an active area and a pair of electrodes, and absorbs electromagnetic radiation incident upon the active area within a response band of wavelengths. A portion of the absorbed electromagnetic radiation is converted into an electrical potential difference between the electrodes.

The prefiltering means comprises means for absorbing a substantial fraction of electromagnetic radiation incident upon the prefiltering means within a prefiltering band. At least a portion of the prefiltering band lies outside of the response band of the photovoltaic means, but within the solar band of the incident solar energy. The photovoltaic means and the prefiltering means are positioned such that the solar energy must pass through the prefiltering means to strike the active area of the photovoltaic means. Thus, some of the solar energy outside of the response band is absorbed by the prefiltering means, and is not incident upon the photovoltaic means. By removing some of the out of band energy, the prefiltering means lets the photovoltaic means operate at a lower temperature, thereby increasing the conversion efficiency.

In a second preferred embodiment, the solar energy system of the present invention comprises primary concentrator means and a receiver. The concentrator means receives the incident solar energy, and focuses it toward a focal spot. The receiver is positioned substantially at the focal spot, and comprises a plurality of photovoltaic cells positioned such that each photovoltaic cell receives approximately the same solar energy flux (energy per unit area) from the concentrator means. In a preferred embodiment, the photovoltaic cells are arranged in a plurality of rings. The photovoltaic cells of each ring are at a constant radius from a central axis common to all rings, and the active surfaces of the photovoltaic cells face outward, away from the central axis.

In a further aspect, the present invention provides a photovoltaic module for converting solar energy into electrical energy. The module comprises a substrate having a relatively large first surface and a relatively small second surface. A first photovoltaic cell is mounted to the first surface, the first photovoltaic cell having a first response band. The module is positioned such that the solar energy is incident onto the active area of the first photovoltaic cell. A second photovoltaic cells substantially smaller than the first photovoltaic cell is mounted to the second surface of the substrate. The substrate is formed such that a portion of the solar energy transmitted by the first photovoltaic cell into the substrate is directed onto the active area of the second photovoltaic cell. Because of the smaller area of the second photovoltaic cell, the cost per unit cell area is lower than in conventional tandem designs.

In a further preferred aspect, the present invention provides a receiver for a solar energy system that includes a phase change material. The phase change material is selected such that it experiences a phase change (e.g., melting) at a temperature that is higher than the normal operating temperature range of the photovoltaic cells, but less than the temperature at which the photovoltaic cells will suffer thermal damage. The phase change material reduces the possibility that the photovoltaic cells will be damaged by coolant loss.

DETAILED DESCRIPTION OF THE INVENTION

Figure 1:
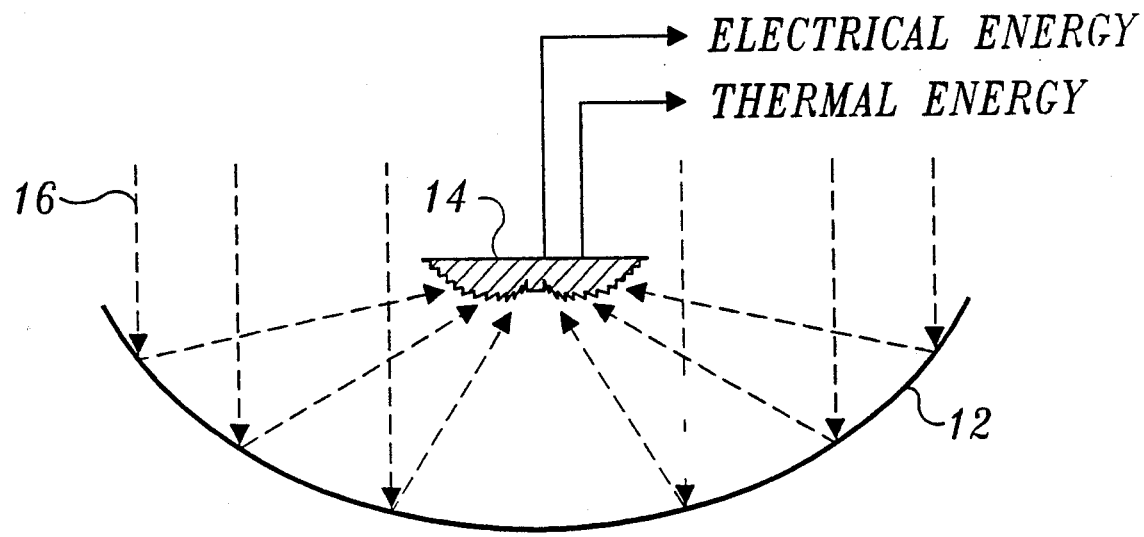
FIG. 1 is a diagram illustrating a solar energy system including a concentrator.

FIGS. 1-7 illustrate the construction and operation of a first preferred embodiment of the solar energy system of the present invention. Referring initially to FIG. 1, the overall system comprises primary concentrator 12 and receiver 14. The concentrator has a shape of a three-dimensional paraboloid, with receiver 14 positioned at the focus. The concentrator receives incident solar energy, symbolized by rays 16, and reflects the solar energy such that it is concentrated onto receiver 14. The receiver converts portions of the solar energy into electrical energy and thermal energy. The thermal energy is in the form of a fluid heated above ambient temperature.

Figure 2:
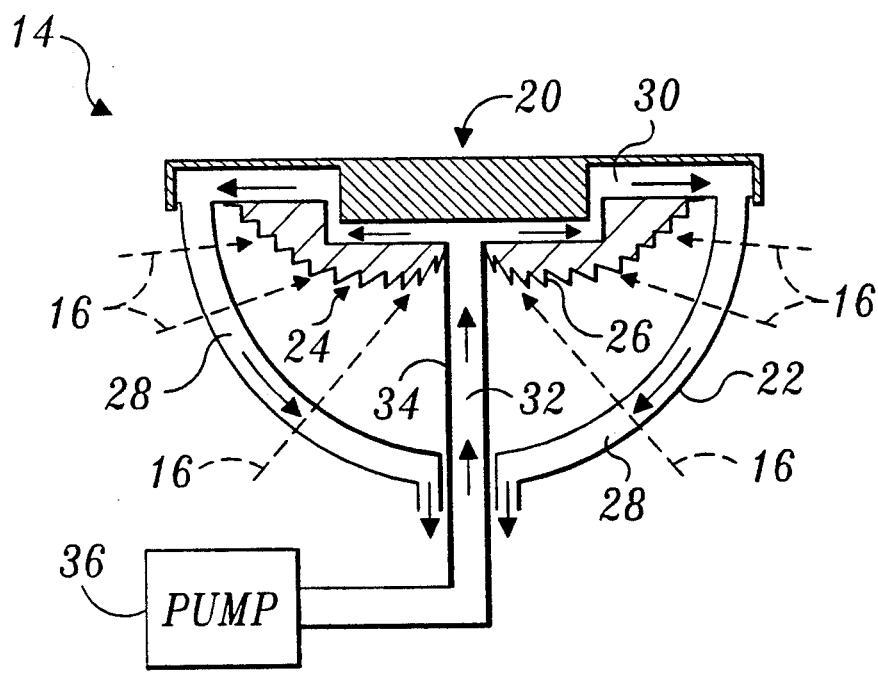
FIG. 2 is a diagram illustrating a preferred embodiment of the receiver.

A preferred embodiment of receiver 14 is illustrated in greater detail in FIG. 2. The receiver comprises a disk-shaped base 20, and hemispherical prefilter 22. One surface of base 20 (the lower surface in FIG. 2) comprises a serrated mounting surface 24 to which a plurality of photovoltaic cells 26 are mounted. The particular arrangement of the serrations and photovoltaic cells is described in greater detail below. Prefilter 22 substantially surrounds the photovoltaic cells, such that the solar radiation from the concentrator (symbolized by rays 16) must pass through the prefilter before striking the cells. Prefilter 22 comprises a jacket that includes an internal passageway 28 through which a fluid can flow. Passageway 28 communicates with passageway 30 formed in base 20. Base passageway 30 is in turn coupled to pump 36 by central passageway 32 that is formed by tube 34, the tube extending outwardly from the center of the base.

In operation, a heat transfer fluid such as water is pumped by pump 36 into tube 32, from which point the water spreads outward through a plurality of passageways 30 in the base. It will be understood that passageways 30 are illustrated schematically in FIG. 2, to simplify the illustration. The heat transfer fluid cools the base and the attached photovoltaic cells, as further described below, and is in turn heated by the base to a first temperature above the inlet temperature. The once heated fluid then flows through passageway 28 in prefilter 22, and in so doing intercepts a portion of solar radiation 16 passing through the prefilter. This raises the fluid temperature to a second temperature, above the first temperature. The twice heated fluid exiting from passageway 28 forms the thermal energy output of the system. This heated fluid may be used directly, for example as hot water, or may be input to a heat exchanger for other known applications.

Figure 3:
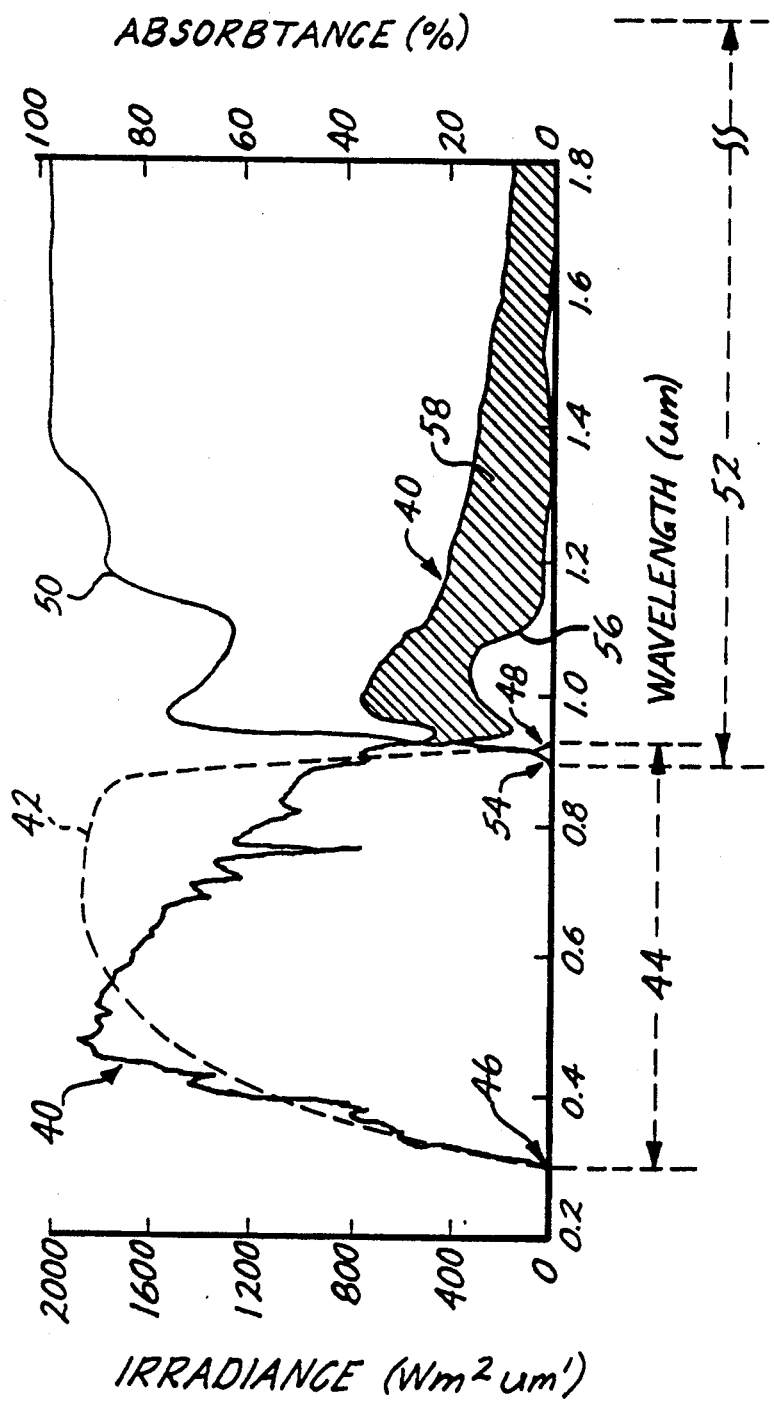
FIG. 3 is a graph illustrating the prefiltering.

An important function of the prefilter may be described with reference to FIG. 3. In this graph, curve 40 represents the spectrum of solar energy, i.e., the solar irradiance, at the earth's surface. The solar spectrum has an upper (short wavelength) cutoff at about 0.3 microns, and has a long tail extending into the infrared. Curve 42 represents the relative response of a typical gallium arsenide photovoltaic cell. Response curve 42 lies within response band 44 that has a short wavelength limit 46 at about 0.3 microns, and a long wavelength limit 48 at about 0.9 microns. A comparison of solar spectrum 40 and response curve 42 illustrates that gallium arsenide cells are a good choice for a solar energy system. However, other types of photovoltaic cells may also be used to implement the present invention.

Curve 50 illustrates the percentage of absorbance of a 0.4 inch thick film of water, such as water flowing through prefilter 22 of FIG. 2. It can be seen that curve 50 lies within a prefiltering band 52 that has a short wavelength limit 54 very close to the long wavelength limit 48 of response band 44. The purpose of the prefiltering represented by curve 50 is to remove as much as possible of the solar radiation that lies outside of response band 44, without letting such radiation reach the photovoltaic cells. In FIG. 3, curve 56 represents the result of multiplying the absorbance represented by curve 50 by solar spectrum 40. Thus the shaded region 58 represents the energy removed from the solar spectrum by a prefilter that comprises a 0.4 inch water film.

The prefilter enhances the performance of the receiver, by removing "out of band" infrared energy from the solar spectrum. Because prefiltering band 52 lies almost entirely outside response band 44, the removed energy represents energy that the photovoltaic cell can not convert to electricity. Overall, gallium arsenide photovoltaic cells are capable of converting about 20% of the energy of incident sunlight into electricity. This leaves 80% of the energy to appear as heat in the receiver. However, about 40% of the incident solar energy is out of the gallium arsenide response band. In the ideal case, all of this energy is removed by prefiltering, leaving only 40% of the incident solar energy to appear as heat in the receiver. Thus up to a 50% reduction (80% to 40%) of the heat generated in the receiver can be achieved. Such a reduction will significantly lower the cell operating temperature, thereby increasing the conversion efficiency. Similar improvements are possible with other types of photovoltaic cells, such as silicon cells. In general, the absorption of out-of-band energy in the prefilter may be enhanced by constructing the prefilter jacket from an infrared absorbing glass such as the Schott-America KG-Series glasses.

The prefilter is especially advantageous for a cogenerative photovoltaic system. In particular, in addition to relieving the thermal load on the photovoltaic cells, the prefilter facilitates low temperature, efficient electrical conversion, and simultaneously enables a two-stage heat removal system capable of delivering a heated fluid at approximately twice the cell operating temperature (with respect to ambient).

FIGS. 4-8 illustrate further details of a preferred embodiment of base 20 to which the photovoltaic cells are mounted. The disk-shaped base is shown in cross section in FIG. 4, and is symmetric about central axis 60. The receiver comprises a series of mounting faces 62($i$) on which the photovoltaic cells 26 are mounted, the mounting faces being oriented vertically in FIG. 4. Each mounting face has the form of a cylindrical shell of height h that encircles axis 60 at a radius $R_i$. The different mounting faces all have different radii $R_i$, but the same height h. The mounting faces are joined to one another by connecting faces 64 that are oriented substantially parallel to the incoming solar radiation 16 that has been reflected towards the receiver by the primary concentrator. Thus the connecting faces do not block any of the incoming radiation, and substantially all of such radiation falls on one of the mounting faces. However, to allow for imperfections in the primary concentrator, as well as for the finite angular size of the solar disk, a small amount of radiation will in fact strike the connecting faces. The connecting faces may therefore be coated with a reflecting material, so that any radiation that does strike the connecting faces is reflected onto the adjacent mounting faces.

Figure 5:
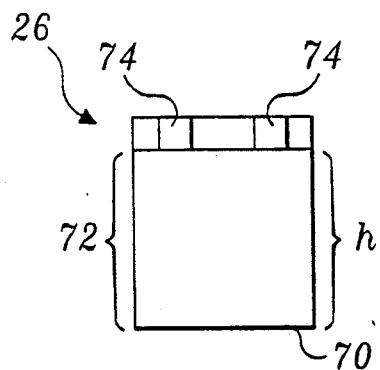
FIG. 5 is a plan view of a photovoltaic cell.
Figure 6:
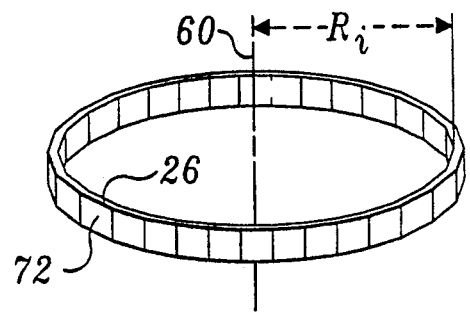
FIG. 6 is a perspective view showing the photovoltaic cells in a single ring.

A plurality of photovoltaic cells 26 are mounted on each mounting face, such that they completely cover the mounting face. As illustrated in FIG. 5, in one preferred embodiment, each photovoltaic cell 26 comprises a rectangular body 70 having an active area 72 of height h that covers most of one side of body 70, and a pair of electrodes 74 formed adjacent to the active area. The photovoltaic cell converts a portion of the solar energy incident on the active area into a potential difference between the electrodes. As illustrated in FIG. 6, the photovoltaic cells 26 that are mounted to a given mounting face 62($i$) form a ring of radius $R_i$, with active surfaces 72 facing outwardly away from central axis 60 of the receiver base. This design permits the use of a standard size photovoltaic cell. As will be described more fully below, cells 26 are positioned on mounting face 62($i$) such that active areas 72 fully cover the mounting faces, with the portion of the cells containing electrodes 74 being received in slot in base 20. This arrangement maximizes the effective active area of the receiver.

Figure 7:
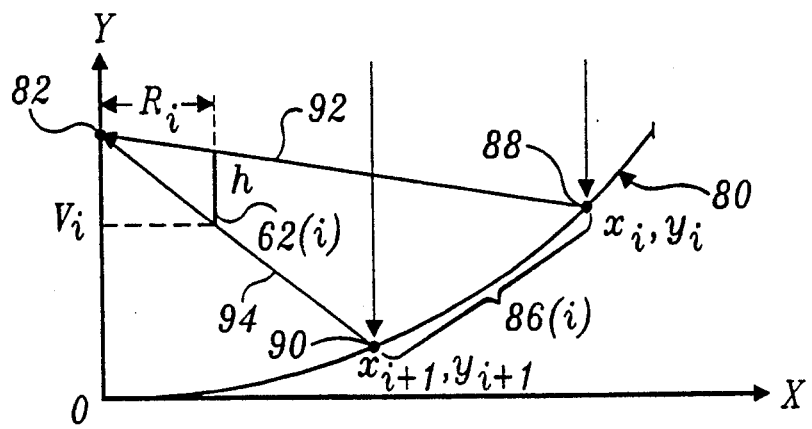
FIG. 7 is a graph illustrating a technique for positioning the photovoltaic cells.

The relative positions of mounting faces 62($i$) are preferably selected such that an equal solar energy flux falls on the photovoltaic cells on all the mounting faces. A method of determining the appropriate mounting face positions is illustrated in FIG. 7, for the case in which the prefilter does not bend the incoming rays from the concentrator (e.g., a hemispherical prefilter). In this diagram, reference numeral 80 represents the primary concentrator, which is assumed to have a parabolic shape with its center at the origin O of an X-Y coordinate system. For the purpose of this example, it will be assumed that in the illustrated X-Y plane, the shape of the primary concentrator is governed by:

$$y = 0.05x^2 \qquad (1)$$

The receiver 82 is centered at the focal point of the parabola, at coordinates (0, 5). Reference numeral 62($i$) designates the mounting face or, equivalently, the active areas of the cells that will be affixed to the mounting face.

Imagine that the surface of the primary concentrator is broken up into a set of side-by-side annular areas, the boundaries between adjacent annular areas being at X coordinates $x_1, \ldots x_i, x_{i+1}, \ldots$, with $x_1$ being the outermost edge of the primary concentrator. The cells on a given mounting surface will be arranged to intercept all of the solar radiation reflected towards the receiver by a given annular ring. Thus in FIG. 7, the photovoltaic cells on mounting surface 62($i$) will be positioned to intercept all solar radiation reflected from ring 86($i$) that extends between circle 88 at coordinates $x_i$, $y_i$, and circle 90 at coordinates $x_{i+1}$, $y_{i+1}$. Line 92 is constructed between receiver 82 and circle 88, and line 94 is constructed between receiver 82 and circle 90. The radius of the mounting surface 62($i$) corresponding to ring 86($i$) is $R_i$, the vertical position of the base of the mounting ring is at $V_i$, and it is desired to find the set of radii $R_i$ and vertical positions $V_i$ for all mounting rings, such that each mounting ring receives the same amount of solar radiation per unit area.

The area of the solar radiation intercepted by ring 86($i$) is $$A_p = \pi(x_i^2 - x_{i+1}^2) \qquad (2)$$

while the corresponding area of the photovoltaic cells that intercept this radiation is $$A_{pv} = 2\pi R_i h \qquad (3)$$

It is desired that the ratio of $A_p$ to $A_{pv}$ should be held constant at some suitable concentration factor C. Thus $$\frac{x_i^2 - x_{i+1}^2}{2R_i h} = C \qquad (4)$$

which can be rearranged to produce $$h = \frac{x_i^2 - x_{i+1}^2}{2R_i C} \qquad (5)$$

A second equation for h can be found by determining the equations of lines 92 and 94, substituting in the value $x = R_i$ to determine the Y coordinates of the top and bottom of mounting face 62($i$), and setting the difference between such Y coordinates equal to h. This produces $$h = \frac{(5 - 0.05x_{i+1}^2)R_i}{x_{i+1}} - \frac{(5 - 0.05x_i^2)R_i}{x_i} \quad (6)$$

Figure 4:
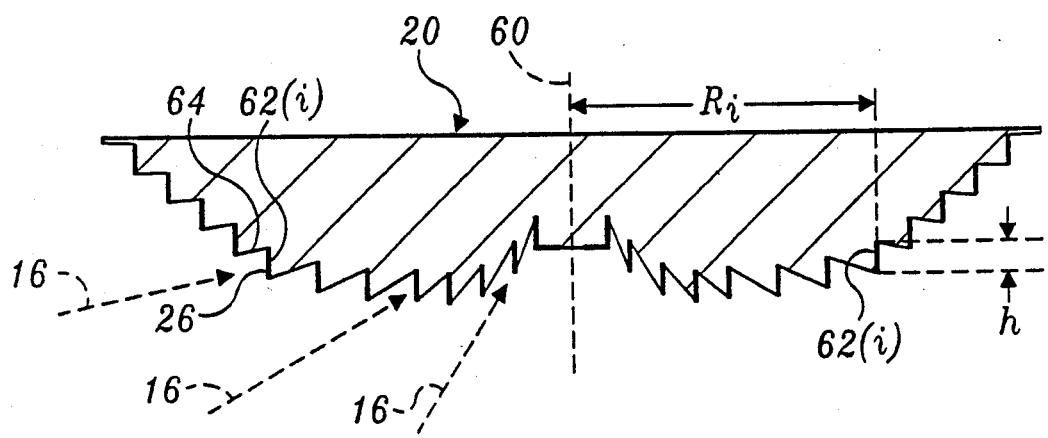
FIG. 4 is a cross-sectional view of the receiver.

Equations 5 and 6 can be solved iteratively, holding the height h constant, to determine the radii $R_i$ of the cylindrical bands on the receiver that will intercept, at a constant concentration factor C, the energy reflected from a series of annular areas 86(i) on the primary concentrator. These radii can be inserted into the equations for the corresponding lines 94 to determine the vertical positions $V_i$ of the rings. A resulting receiver shape for a concentration factor of 500 is shown in FIG. 4. The disposition of the cells determined in this manner minimizes the area of the photovoltaic cells required, and solves one of the most difficult problems encountered by photovoltaics in concentrator systems, i.e., nonuniform illumination of the cells.

Figure 8:
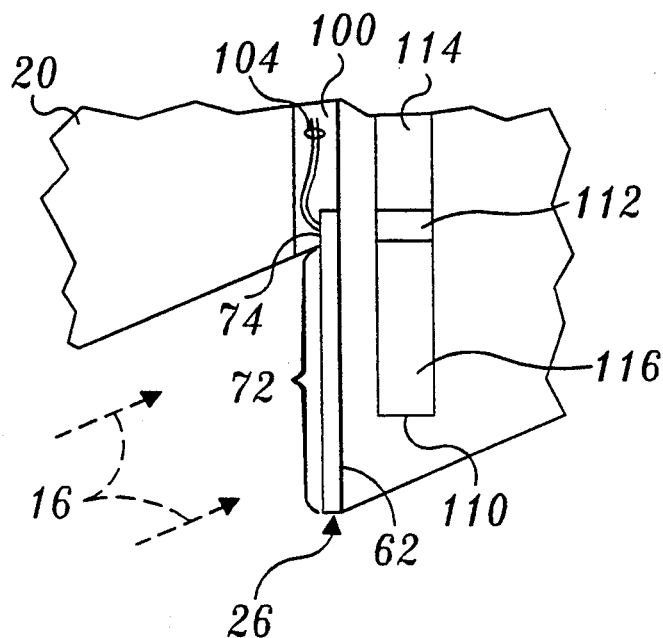
FIG. 8 is a partial cross-sectional view showing the mounting of a cell.

Further preferred aspects of the receiver design are illustrated in FIG. 8. To provide maximum efficiency, the technique for electrically interconnecting the photovoltaic cells should not block any of the incoming radiation, or cause any of active areas of the cells to be otherwise unused. This may be achieved by mounting the photovoltaic cells 26 on each mounting face 62 such that active surfaces 72 receive the incoming radiation 16, with electrodes 74 positioned in a recess 100 formed in receiver body 20. A pair of wires 104 are connected to the electrodes, and lead the electrical voltage signal out of the receiver body into a suitable utilization circuit.

FIG. 8 illustrates two additional preferred aspects of the present invention. A slot 110 is formed in receiver body 88, such that the inner end of slot 110 is positioned behind mounting face 62. A plug 112 is then positioned in slot 110 in the position illustrated. Plug 112 may be formed of the same material (e.g., copper) as base 20, and may be held in place by a high temperature silver solder or the like. The portion of the slot above plug 112 is then filled with a phase change material 114, for example, an indium-tin alloy. The portion of slot 110 below plug 112 forms a passageway 116 for a cooling fluid, such as the cooling passageway 30 schematically shown in FIG. 2.

Phase change material 114 provides overheating protection for the receiver. The phase change material is selected such that it experiences a phase transition at a temperature that is above the normal operating temperature range of the photovoltaic cells, but below the thermal damage threshold for the photovoltaic materials. Thus, when the temperature rises above the normal operating range to the phase transition temperature, the phase of the phase change material will change, thereby absorbing a quantity of heat, while maintaining the receiver at a substantially constant temperature, until the phase change is complete. In general, the most convenient phase change material will be those having melting points in the required temperature range. For gallium arsenide solar cells, a typical maximum operating temperature is 85° C., while a typical thermal damage threshold temperature is 350° C. Thus, a preferred phase change material would be a material such as an indium-tin alloy, having a melting point in this range.

The location of passageways 116 just behind the photovoltaic cells 26 minimizes the distance that the heat must be conducted. If it is assumed that the heat conduction path through copper base 20 from cell 26 to cooling passageway 116 is 0.1 inches with a thermoconductivity of 3.85 watts/cm, and that the heat transfer coefficient of the cooling fluid is 6000 BTU/hr-ft$^2$ °F. for water flowing at 3 ft/sec, the maximum temperature difference between the cells and the fluid will be 3.8° C.

The main considerations for the hydraulic design of the cooling system are that the volume of flow be sufficient to carry away the excess heat with an appropriate rise in temperature; that the flow velocity be adequate to produce a film heat transfer coefficient sufficiently low to maintain the desired cell operating temperature; and that the strength of the receiver will be adequate to contain the combination of pressure produced by the fluid pump and the hydrostatic pressure produced by the rise in temperature of the fluid. The temperature rise in the fluid above an assumed input temperature of 30° C. may be calculated by assuming no electrical load (the worst case). The result of the calculation is a thermal heat load of 23,350 watts, a desired temperature rise of 120° C. for an exit temperature of 150° C., and a flow rate of 0.718 gallons per minute. The flow velocity is determined by the coolant channel size and the flow volume. However, the velocity must also meet the constraint imposed by the film heat transfer coefficient requirement. As described above, a flow velocity of 3 ft/sec meets the heat transfer requirements. If the cross section of passageways 116 is 0.5 cm, then the required height of the passageway may be determined to be about 1 cm. The hydrostatic pressure generated by water at 150° C. is about 26 psi. The pumping pressure drop at a flow rate of 0.718 gallons per minute will be much less than the hydrostatic pressure. Copper walls 0.1 inch thick can easily withstand such pressures.

As previously mentioned, tandem solar cells have been used to increase the efficiency of the solar-to-electrical conversion process. In a tandem cell design, a primary cell intercepts the incident solar energy, and converts a fraction of it to electricity. Some of the solar energy not converted to electricity produces heat in the primary cell. However, a second unconverted portion is transmitted through the primary cell, and strikes a secondary cell that has a response band different from that of the primary cell. The secondary cell is used to generate electricity from those portions of the solar spectrum to which the primary cell is not responsive.

Figure 9:
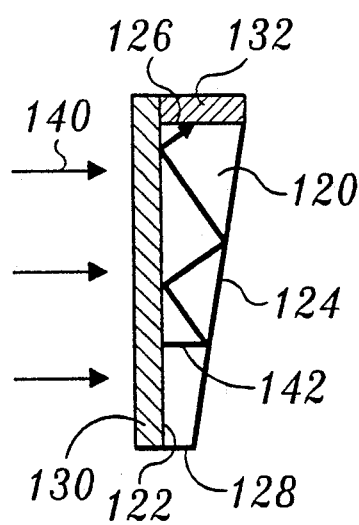
FIG. 9 is a schematic cross-sectional view of a two cell module.
Figure 10:
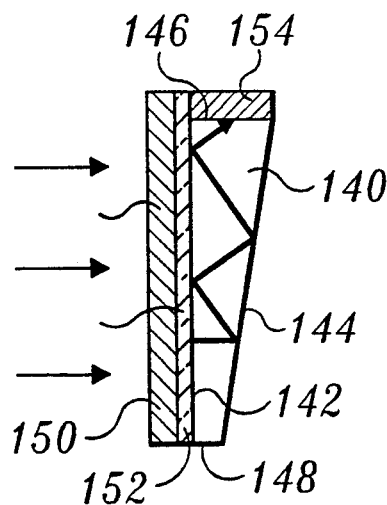
FIG. 10 is a schematic cross-sectional view of a three cell module.
Figure 11:
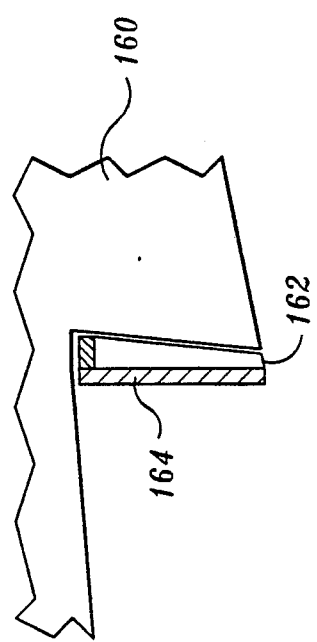
FIG. 11 is a partial cross-sectional view showing the positioning of a multicell module in the receiver.

A basic problem with tandem cell designs is that they require essentially double the cell area, but the secondary cell typically only produces up to about 30% of the electrical energy produced by the primary cell. Thus the cost is approximately doubled, while only producing a 30% increase in output. FIGS. 9-11 illustrate preferred embodiments of photovoltaic cell modules that overcome this problem. Referring initially to FIG. 9, a first preferred cell module comprises a wedge-shaped substrate 120 having a pair of relatively large surfaces 122 and 124, and a pair of relatively small surfaces 126 and 128. Larger surfaces 122 and 124 are not parallel, but are oriented at a small angle (e.g., 10°) with respect to one another.

A primary photovoltaic cell 130 is formed on surface 122, and a secondary photovoltaic cell 132 is formed on surface 126. The primary and secondary cells are preferably designed so that they have different response bands. By way of example, substrate 120 may comprise gallium arsenide, primary cell 130 may comprise a gallium arsenide photovoltaic cell, and secondary cell 132 may comprise a silicon, GaSb, Ge, or GaInAs photovoltaic cell.

The cell module shown in FIG. 9 is positioned such that solar radiation 140 is incident upon primary cell 130. A large portion of the incident solar radiation that is out-of-band with respect to the primary cell is transmitted through the primary cell into substrate 120. Because of the angle between surfaces 122 and 124, this transmitted radiation 142 is reflected back and forth between surfaces 122 and 124, toward surface 126. At surface 126, the radiation traveling through the substrate strikes secondary cell 132, and a portion of such radiation is converted into electricity. Substrate 120 in effect acts as a concentrator, since the radiation transmitted by the relatively large area primary cell is concentrated onto a much smaller secondary cell. To insure that the radiation transmitted by the primary cell does not escape through surface 124, it is desirable to fabricate substrate 120 from a relatively high refractive index material, such as gallium arsenide, and/or to place a reflective coating on surface 124. Generally, in module shown in FIG. 9, the area of secondary cell 132 may be 10–150 times smaller than the area of the primary cell.

A second preferred embodiment of a multicell module is illustrated in FIG. 10. This embodiment comprises substrate 140 having relatively large surfaces 142 and 144 and relatively small surfaces 146 and 148. A first primary cell 150 and a second primary cell 152 are formed on surface 142, with cell 152 lying between cell 150 and surface 142. A smaller secondary cell 154 is formed on surface 146. The three cells preferably all have different response bands. For example, substrate 140 may comprise silicon, primary cell 150 may comprise gallium arsenide, primary cell 152 may comprise silicon, and secondary cell 154 may comprise GaSb, Ge, or GaRnAs. In such a design, the first primary cell (GaAs) will transmit energy longer than about 0.9 microns, and the second primary cell (Si) will absorb and convert energy in the 0.9–1.1 micron band, and transmit energy longer than about 1.1 micron. Secondary cell 154 will have a response band at least partially in the range longer than 1.1 microns.

For the modules of FIGS. 9 and 10, the use of a high index of refraction substrate will make the module very tolerant to angular variations in the incident radiation. For example, for a gallium arsenide substrate, the incident radiation can vary up to 60 degrees from normal, and still be trapped in the substrate. Conical prisms can also be used, instead of wedges, if higher concentration factors are desired.

FIG. 11 illustrates how cell modules such as those shown in FIGS. 9 and 10 may be integrated into a receiver of the type illustrated in FIG. 4. The receiver body 160 is shaped as in FIG. 4, except that an additional cut-back or recess is formed in each mounting surface, the recess being shaped so as to receive cell module 162 such that the primary cell 164 of the cell module occupies the same position as photovoltaic cell 26 in the FIG. 4 design. The overall receiver operates in a manner similar to that described above in connection with FIGS. 1–8.

Figure 12:
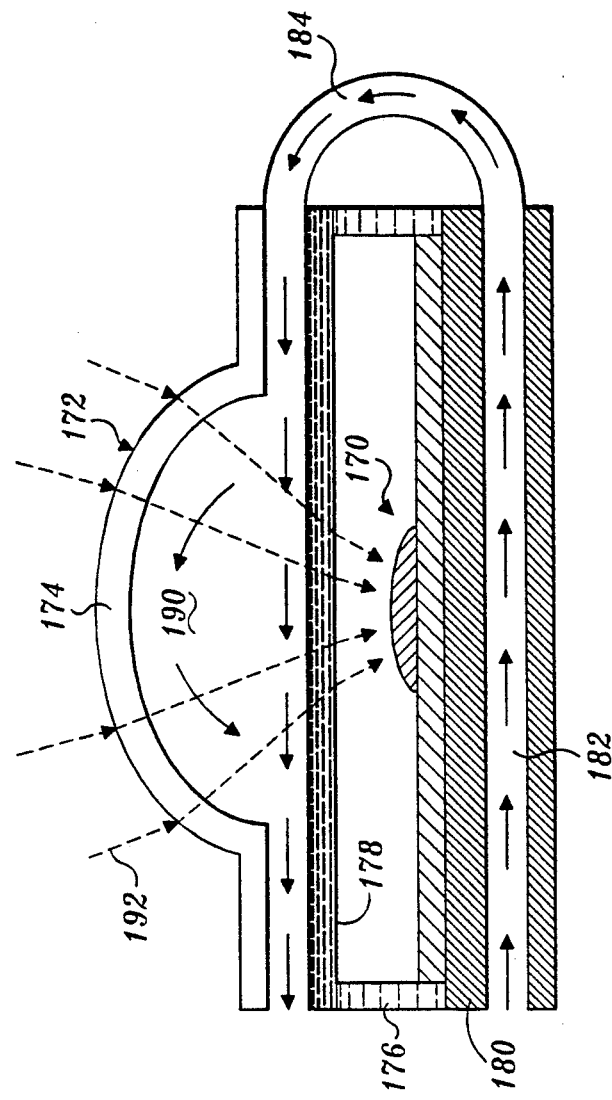
FIG. 12 is a schematic cross-sectional view of a second preferred receiver design.

A further preferred embodiment for the receiver is schematically illustrated in FIG. 12. As in the embodiment of FIG. 2, the receiver comprises a disk-shaped base 170 and prefilter 172. The photovoltaic cells are mounted to base 170, in a manner generally similar to that shown in FIG. 4. However, in this design, prefilter 172 comprises a solid shell 174 having a nonspherical shape. Base 170 is mounted in an enclosure 176 having a transparent upper surface 178. A mounting block 180 underlying enclosure 176 includes passageway 182 through which a cooling fluid is pumped. Passageway 182 communicates with the volume 190 between shell 174 and enclosure 176, via conduit 184. Thus, as in the design of FIG. 2, the cooling fluid first cools base 170, and then passes through the prefilter, where it directly absorbs some of the out-of-band incoming radiation. However, in the design in FIG. 12, the prefilter also functions as a lens, to focus and therefore further concentrate incoming solar radiation 192. In this case, the focusing provided will be a function of the index of refraction of the cooling fluid. Therefore in this design, it is generally desirable to use a high index fluid, such as a silicon-based oil or mineral oil, to increase the focusing. Using the prefilter to act as a secondary concentrating lens can relieve requirements of the expensive primary concentrator, thereby lowering system costs.

While the preferred embodiments of the invention have been illustrated and described, variations will be apparent to those skilled in the art. Accordingly, the scope of the invention is to be determined by reference to the following claims.

The embodiments of the invention in which an exclusive property or privelege is claimed are defined as follows:

1. A solar energy system for converting solar energy into electrical energy, the solar energy comprising electromagnetic radiation having wave lengths within a solar band, the system comprising:

a solar concentrator for reflecting solar energy incident thereon and for focusing the reflected solar energy to a focal point of said concentrator;

a solar receiver located approximately at the focal point of said concentrator, the solar energy receiver including photovoltaic means comprising an active area, a pair of electrodes, and means for absorbing electromagnetic radiation incident upon the active area within a response band of wavelengths for converting a portion of the electromagnetic radiation so absorbed into an electrical potential difference between the electrodes, the response band including a portion of the solar band;

prefiltering means comprising means for absorbing a substantial fraction of electromagnetic radiation incident upon the prefiltering means within a prefiltering band of wavelengths, wherein the prefiltering means includes a conduit spaced away from the photovoltaic means and configured to further focus the focused solar energy from the solar concentrator passing through the conduit onto the photovoltaic means, a substantial portion of the prefiltering band lying outside of the response band and within the solar band, the photovoltaic means and the conduit being positioned such that a substantial portion of the solar energy must pass through the conduit to strike the active area of the photovoltaic means, wherein a substantial portion of the solar energy outside the response band is absorbed by the prefiltering means and is not incident upon the photovoltaic means; and a heat conducting base element having a passageway formed therein, to which said photovoltaic means is mounted, the passageway being in fluid communication with the conduit, such that the fluid moves serially through the passageway and the conduit, wherein the fluid does not come into direct contact with the photovoltaic means.

2. The system of claim 1, wherein the prefiltering means includes means for pumping a fluid serially through the conduit and the passageway in the base, the conduit being positioned in front of the photovoltaic means such that said substantial portion of the solar energy must pass through the conduit and through the fluid contained therein to strike the active area of the photovoltaic means.

3. The system of claim 1, wherein the response band extends between a short wavelength limit and a long wavelength limit, and wherein the prefiltering means absorbs a substantial fraction of the electromagnetic radiation that lies within the solar band and that has a wavelength longer than the long wavelength limit.

4. The system of claim 1, wherein the conduit has an approximately hemispherical shape, and wherein the photovoltaic means is positioned approximately at the center of said hemispherical shape.

5. The system of claim 1, including a fluid entry conduit which extends to the passageway in the heat conducting base element approximately at a mid-point thereof and at a right angle relative thereto, the prefiltering conduit extending from opposing ends of the passageway to the immediate vicinity of fluid entry conduit, from where fluid exits from the system, the prefiltering conduit having an approximately hemispherical shape.

6. A co-generation method for converting solar energy into electrical energy and into thermal energy in the form of a heated fluid, the method comprising the steps of:

providing a solar concentrator for reflecting solar energy incident thereon and focusing the reflected solar energy to a focal point of said concentrator;

providing a receiver located approximately at the focal point of said concentrator, the receiver comprising a heat conducting base and a photovoltaic means mounted to the base, the base having a passageway formed therein, the photovoltaic means comprising means for absorbing electromagnetic radiation and for converting a portion of the electromagnetic radiation so absorbed into electrical energy; and pumping a fluid serially through the passageway and through a conduit positioned such that the solar energy passes through the fluid in the conduit before striking the photovoltaic means, without the fluid coming into contact with the photovoltaic means, wherein the conduit is configured so as to further focus the focused solar energy from the solar concentrator onto the photovoltaic means, whereby the fluid receives thermal energy from the base while traveling through the passageway and from the solar energy while traveling through the conduit, such that the fluid is at a sufficient temperature, approximately twice the temperature of the photovoltaic means, upon exit from the conduit, to accomplish co-generation work.

7. The method of claim 6, wherein at least a portion of the electromagnetic energy absorbed by the fluid in the conduit is in a wavelength range to which the photovoltaic means is substantially unresponsive to generate electrical energy.

* * * * *